United States Patent [19]

Ichikawa

[11] Patent Number: 4,648,114
[45] Date of Patent: Mar. 3, 1987

[54] AM STEREO DEMODULATOR
[75] Inventor: Toshihito Ichikawa, Saitama, Japan
[73] Assignee: Pioneer Electronic Corporation, Tokyo, Japan
[21] Appl. No.: 783,506
[22] Filed: Oct. 3, 1985
[30] Foreign Application Priority Data Oct. 3, 1984 [JP] Japan .................................. 59-207808

[51] Int. Cl.⁴ ............................................... H04H 5/00
[52] U.S. Cl. ...................................... 381/15; 329/112; 329/124; 329/137
[58] Field of Search ....................... 329/112, 124, 137; 381/15, 16, 10, 13, 11

[56] References Cited

U.S. PATENT DOCUMENTS 4,232,189 11/1980 Leitch .................................... 381/15
4,339,631 7/1982 Nishioka ............................... 381/15
4,349,696 9/1982 Akitake et al. ....................... 381/15
4,358,638 11/1982 Numata et al. ....................... 381/15
4,375,580 3/1983 Sauer ..................................... 381/15
4,536,885 8/1985 Loughlin .............................. 381/15

Primary Examiner—Forester W. Isen
Attorney, Agent, or Firm—Sughrue, Mion, Zinn, Macpeak & Seas

[57] ABSTRACT

An AM stereo demodulator with which the transition from the stereo receiving mode to the monaural receiving mode upon a reduction in the field strength of the received signal is made gradual so as to eliminate an abrupt change in the sound quality. For stereo demodulation, a pair of reference signals are generated which are $\pi/2$ different in phase for stereo reception. As the field strength of the received signal approaches the level where a phase-locked loop in the demodulator would become unlocked from the carrier of the received signal, the phase difference between the two reference signals is gradually reduced to $\pi/4$.

6 Claims, 6 Drawing Figures

AM STEREO DEMODULATOR

BACKGROUND OF THE INVENTION

The present invention relates to an AM stereo demodulator, and more particularly, to a system for demodulating a quadrature-modulated AM stereo signal.

A conventional system of the same general type to which the present invention pertains is shown in FIG. 1, wherein reference numeral 1 is a divider, 2 and 3 are multipliers that perform coherent detection and respectively provide demodulated left- and right-channel signals, 4 is a limiter that removes all amplitude variations from the received AM stereo signal, 5 is a cosine detector that extracts the cosine components from the output of the limiter, 6 and 7 are switches that perform selection of the proper reference signal for coherent detection as one of the multiplication inputs to the multipliers 2 and 3; 8 is a phase-locked loop (PLL) for obtaining a reference signal for coherent detection form the AM stereo signal; 9 and 10 are phase shifters that respectively change the phase of the output of PLL 8 by $+\pi/4$ and $-\pi/4$, 11 is a lock detector for the PLL 8, 12 is an IF level detector for use in the detection of the intensity of an electric field, and 13 is an OR gate that receives the output of the lock detector 11 and that of the level detector 12 as two inputs and which controls the operation of the switches 6 and 7 in accordance therewith.

If an AM stereo signal $v(t)$ is generated by the Motorola system, it is expressed by:

$$v(t) = A[1 + k(L + R)] \cdot \cos(\omega_c t + \phi) \quad (1)$$
$$= \tan^{-1} k(L - R)/[1 + k(L + R)],$$

wherein A and k are constants, L and R are left- and right-channel signals, and $\omega_c$ is a carrier angular frequency. Rewriting Eq. (1):

$$v(t) = (A/\sqrt{2})[(1 + 2L) \cdot \cos(\omega_c t + \pi/4) + \quad (2)$$
$$(1 + 2kR) \cdot \cos(\omega_c t - \pi/4)] \cdot \cos\phi.$$

The AM stereo signal $v(t)$ expressed by Eq. (2) is applied to the limiter 4 and PLL 8, which is response deliver outputs to the cos $\phi$ detector 5 for detection of the cos $\phi$ component in each output. Therefore, in the divider 1, the AM stereo signal $v(t)$ expressed by Eq. (2) is divided by cos $\phi$ to eliminate the cos $\phi$ component.

The reference signal obtained from the PLL circiut 8 is fed to the phase shifters 9 and 10, wherein the phase of the signal is changed by $+\pi/4$ and $-\pi/4$ to produce two reference signals, cos $(\omega_c t + \pi/4)$ and cos $(\omega_c t - \pi/4)$, which differ in phase by 90°. These two reference signals are multiplied by the output of the divider 1 in the multipliers 2 and 3. The division output of the divider 1 may be expressed by:

$$v(t)/\cos\phi = (A/\sqrt{2})[(1 + 2kL) \cdot \cos(\omega_c t + \pi/4) - \quad (3)$$
$$(1 + 2kR) \cdot \cos(\omega_c t - \pi/4)].$$

Multiplying Eq. (3) by each of the two reference signals, cos $(\omega_c t + \pi/4)$ and cos $(\omega_c t - \pi/4)$, coherent detection of the L and R components is realized.

It is necessary to maintain the S/N ratio at a high level even if the intensity of the received electric field is reduced or the PLL 8 is in the unlocked condition. In order to meet this requirement, the switches 6 and 7 are controlled by the outputs of the lock detectors 11 and 12 so that the output of the limiter 4, rather than the outputs of the phase shifters 9 and 10, is fed as a reference signal to the multiplication input of the multipliers 2 and 3. As a result, an envelope detection output is produced by each multiplier, and a change from a stereo to monaural mode is realized to provide an improved S/N ratio.

However, with the conventional system described above, the change from the stereo to the monaural mode is so abrupt that the listener will sense some awkwardness in sound reproduction.

SUMMARY OF THE INVENTION

The present invention has been accomplished in order to eliminate the above-described defect of the conventional system.

The principal object, therefore, of the invention is to provide an AM stereo modulator that changes the stereo separation depending upon the intensity of the received electric field so that the listener will sense no awkwardness in transition from the stereo to the monaural mode, even when the PLL is in the unlocked condition.

The AM stereo demodulator of the present invention includes reference signal generator means for generating a pair of reference signals that are in phase with a pair of carrier components in an AM stereo signal that differ in phase by 90°, limiter means for generating a signal by removing all amplitude variations from said AM stereo signal, coherent detector means for obtaining a demodulated stereo signal by multiplying said AM stereo signal by each of said paired reference signals, and switch means for supplying the output of said limiter means, rather than said pair of reference signals, as one of the amplification inputs of said coherent detector means when said pair of reference signals are not being generated. The demodulator system of the present invention is characterized in that the phases of said pair of reference signals are controlled depending upon the intensity of the received electric field before said intensity is reduced to such a low level that said pair of reference signals are no longer generated. By means of this phase control, the system reduces the stereo separation before a transition from the stereo to the monaural mode mode occurs, thereby ensuring a smooth change to the monaural mode.

DESCRIPTION OF THE PREFERRED EMBODIMENTS

Figure 1:
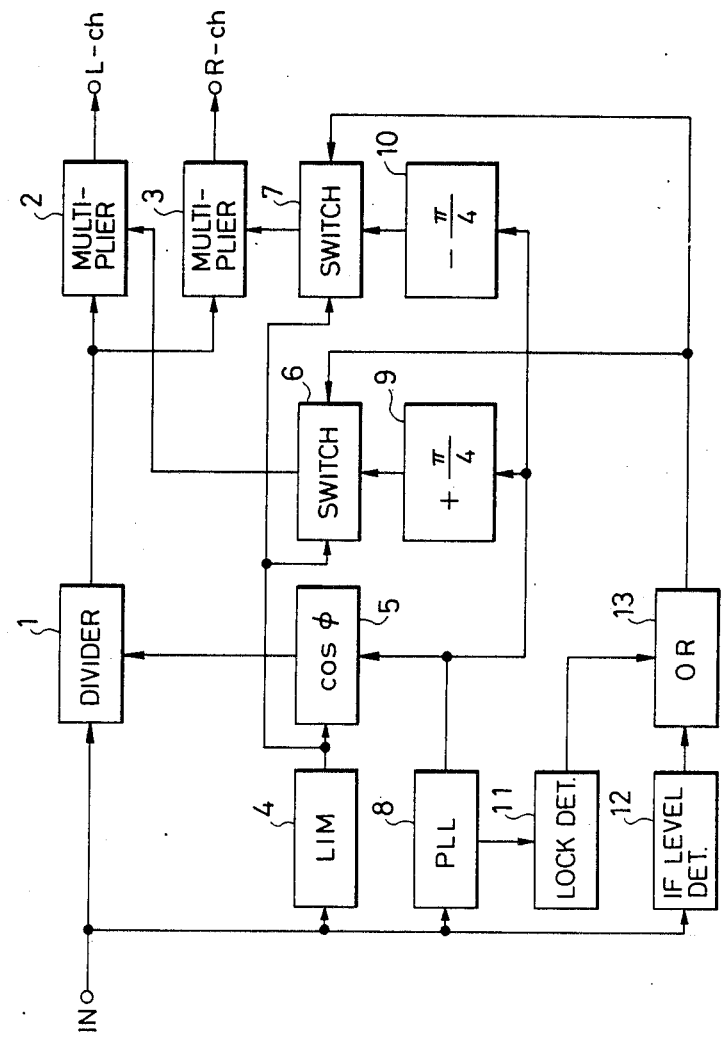
FIG. 1 is a block diagram of a conventional AM stereo demodulator circuit.
Figure 2:
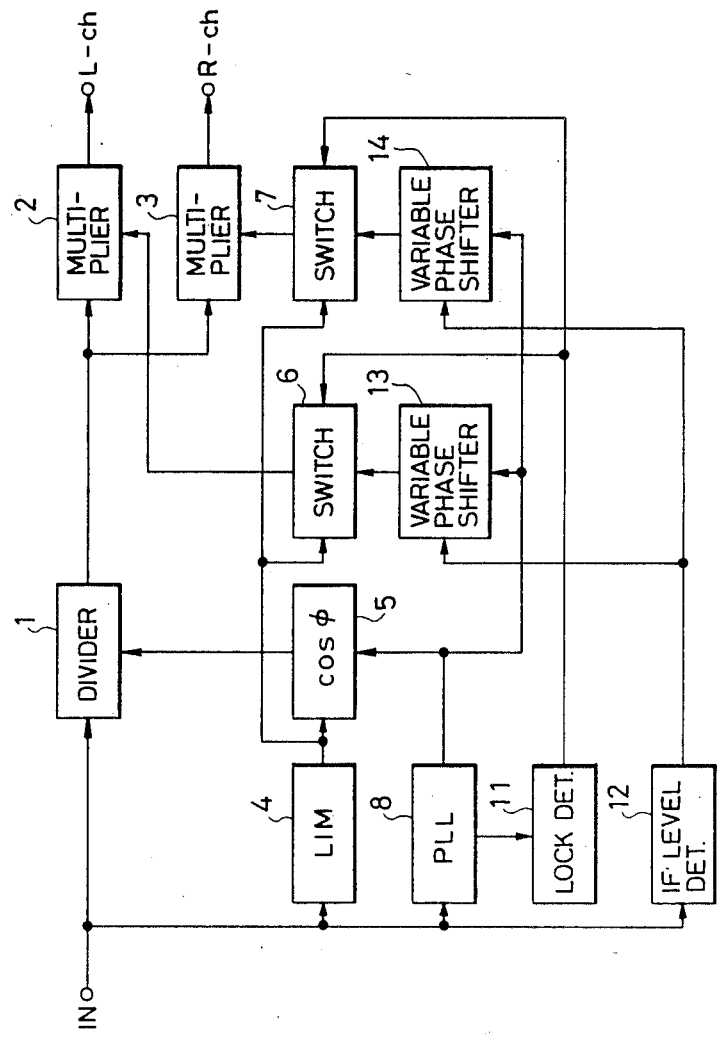
FIG. 2 is a block diagram of an AM stereo demodulator constructed in accordance with a preferred embodiment of the present invention.

FIG. 2 is a block diagram of an AM demodulator constructed in accordance with a preferred embodiment of the present invention. Components which are the same as those shown in FIG. 1 are identified by like reference numerals.

The $+\pi/4$ phase shifter 9 and $-\pi/4$ phase shifter 10 in FIG. 1 correspond to variable phase shifters 13 and 14 in FIG. 2, which are controlled in phase by the output form the level detector 12. The output from the PLL lock detector 11 is directly fed as a control signal to the switches 6 and 7, that is, with no intervening OR gate. The other arrangements of the circuit shown in FIG. 2 are identical to those in FIG. 1, and hence will not be further described in detail.

If the stereo separation in the system shown in FIG. 2 deteriorates before the received electric field becomes weak enough to increase the chance of the PLL 8 being unlocked, a smoother transition from the stereo to the monaural mode will be realized if the PLL is completely unlocked. In order to ensure this, the phases of the reference signals for coherent detection, cos $(\omega_c t \pm \alpha \cdot \pi/4)$, are independently controlled to become loser to cos $\omega_c t$. More specifically, the variable phase shifters 13 and 14 are operated so as to reduce $\alpha$ in cos $(\omega_c t \pm \alpha \cdot \pi/4)$ from one to zero. The respective reference signals for coherent detection are expressed by:

$$\cos(\omega_c t + \alpha\pi/4) = \cos[\omega_c t + \pi/4 - (1-\alpha)\pi/4] \quad (4)$$

$$= \cos(\omega_c t + \pi/4) \cdot \cos(1-\alpha)\pi/4 +$$

$$\sin(\omega_c t + \pi/4) \cdot \cos(1-\alpha)\pi/4$$

$$= \cos(\omega_c t + \pi/4) \cdot \cos(1-\alpha)\pi/4 +$$

$$\cos(\omega_c t - \pi/4) \cdot \sin(1-\alpha)\pi/4,$$

and $$\cos(\omega_c t - \alpha\pi/4) = \cos(\omega_c t - \pi/4) \cdot \cos(1-\alpha)\pi/4 + \quad (5)$$

$$\cos(\omega_c t + \pi/4) \cdot \cos(1-\alpha)\pi/4.$$

In accordance with the present invention coherent detection of Eq. (3) is performed using signals as represented in Eqs. (4) and (5) as reference signals. Thus, the outputs from the multipliers 2 and 3 respectively contain not only the L and R channel components, but also R and L channel components whose detection varies with the value of $\alpha$. Therefore, the system of the present invention causes the stereo separation to vary depending upon the value of $\alpha$.

Figure 3:
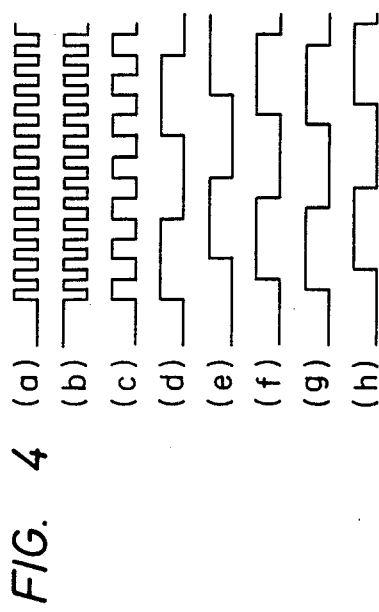
FIG. 3 is a circuit diagram showing an embodiment of the variable phase shifters in FIG. 2.

FIG. 3 is a circuit diagram of a specific embodiment of the variable phase shifters 13 and 14, which are designed so as to cause a gradual change in the phase of reference signals, cos $(\omega_c t \pm \pi/4)$, from $\pm\pi/4$, to $\pm\pi/8$. In FIG. 3, reference numerals 15 to 20 denote delay (D-type) flip-flops (D-FF), 21 is a level comparator, 22 to 25 are AND gates, 26 and 27 are OR gates, and 28 and 29 are inverters.

The output from the PLL 8 is applied both to the clock input of the FF 15 and to the clock input of the FF 19 through the inverter 28. The detection signal from the level detector 12 is compared with a reference level $V_o$ in the level comparator 21, and the output from the comparator is applied both as a gate signal for the AND gates 22 and 24 and as a gate signal for the AND gates 23 and 25 through the inverter 29.

The other outputs of the AND gates 22 to 25 are fed with the Q outputs from the respective FFs 16, 19, 17 and 20. The gate outputs from the AND gates 22 and 23 are applied to the two inputs of the OR gate 26, while the gate outputs from the AND gates 24 and 25 are applied to the two inputs of the OR gate 27. The output from the OR gate 26 is applied to one input of the switch 6, while the output from the OR gate 27 is supplied to one input of the switch 7.

It is assumed that the VCO (not shown) of the PLL 8 is initially locked to a frequency eight times the frequency of the input signal. This locked signal (a) is fed to the FF 15, which produces an output signal (c) whose frequency is half the input frequency. The next-stage FFs 16, 17 and 18 produce output signals (d), (e) and (f) which are phase-locked to the input signal (a) and have respective phases of $-\pi/4$, $\pm\pi/4$ and zero. The signals (d) and (f) are fed to the FFs 19 and 20, which produce signals (g) and (h) having phases of $-\pi/8$ and $+\pi/8$, which are supplied to the switches 6 and 7 through OR gates 26 and 27.

Figure 4:
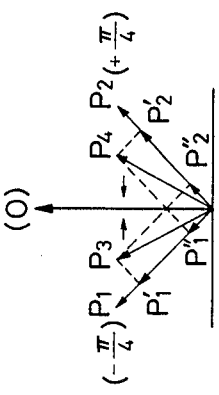
FIG. 4 shows waveforms generated at various points in the circuit of FIG. 3.

As in the conventional system, when the output from the comparator 21 is at the high level, the AND gates 22 and 24 are opened so as to deliver reference signals having phases of $\pm\pi/4$. The waveforms of the signals (a) to (h) generated by the circuit of FIG. 3 are indicated by (a) to (h) in FIG. 4.

Figure 5:
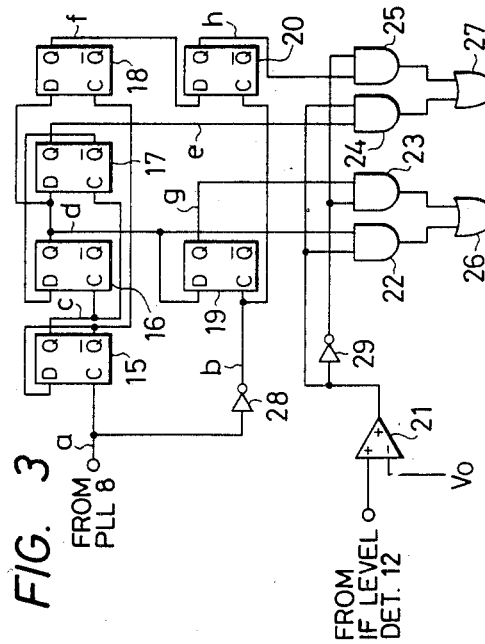
FIG. 5 is a circuit diagram showing another implementation of the variable phase shifters in FIG. 2.

FIG. 5 is a circuit diagram showing another embodiment of the variable phase shifters for obtaining reference signals having continuously varied phases. In FIG. 5, a pair of reference signals, cos $(\omega_c t \pm \pi/4)$, which are assumed to have been obtained from the output of the PLL 8, are respectively applied to the bases of transistors $Q_5$ and $Q_6$, whose collector outputs are current source terminals for a pair of differential amplifiers, one composed of transistors $Q_1$ and $Q_2$, and the other of transistors $Q_3$ and $Q_4$.

The inputs of the pair of differential amplifiers are fed with the output from the level detector 12, and a new pair of phase-shifted reference signals are respectively delivered from the commonly connected collectors of the transistors $Q_1$ and $Q_3$ and from the commonly connected collectors of the transistors $Q_2$ and $Q_4$. In FIG. 5, $R_1$ to $R_4$ denote resistors and $V_o$ represents a bias voltage.

Figure 6:
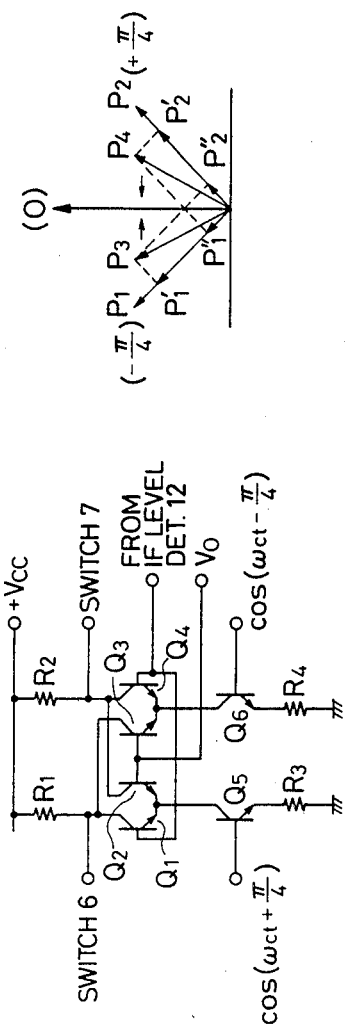
FIG. 6 is vector diagram for signals in the circuit of FIG. 5.

FIG. 6 is a vector diagram for the input and output signals involved in the operation of the circuit in FIG. 5. The input signals are $P_1$ and $P_2$ respectively having phases of $-\pi/4$ and $\pi/4$. If the base voltages of transistors $Q_1$ to $Q_4$ vary with the intensity of the received electric field to cause such changes in the input signals as $P_1 \rightarrow P_1'$, $P_2 \rightarrow P_2'$, $P_1' \rightarrow P_1''$ and $P_2' \rightarrow P_2''$, the output signals will have the phases indicated by $P_3$ and $P_4$. By this procedure, continuous variation in the phases of the reference signals is realized.

The above-illustrated embodiments assume an AM stereo signal generated by the Motorola system, but it should be understood that the concept of the present invention is equally applicable to a system that transmits the main signal (L+R) and the subsignal (L−R) by carriers that differ in phase by $\pi/2$.

As described above, the system of the present invention when operating in a stereo mode gradually reduces the stereo separation before the PLL becomes unlocked when a weak input signal is applied, and hence a smooth transition to the monaural mode is realized, that is, a transition without awkwardness in sound reproduction.

In addition, the change in stereo separation introduces no adverse effects on the demodulated signal since the circuit is designed so as to change the phases of the reference signal for coherent detection.

I claim:

1. An AM stereo demodulator comprising:
an input terminal receiving a variable intensity AM stereo signal having a pair of carrier components that differ in phase by $\pi/2$; reference signal generator means for generating a pair of reference signals that are in phase with said pair of carrier components; limiter means responsive to said AM stereo signal for generating a signal by removing all amplitude variations from said AM stereo signal; coherent detector means for obtaining a demodulated stereo signal by multiplying said AM stereo signal by each of said paired reference signals; switch means for supplying the output of said limiter means, rather than said pair of reference signals, as one of the inputs of said coherent detector means when said pair of reference signals are not being generated; and phase control means for controlling the phase of said pair of reference signals depending upon the intensity of said received AM stereo signal before said intensity is reduced to such a low level that said pair of reference signals are no longer generated.

2. The AM stereo demodulator of claim 1, said reference signals are represented by:

$$\cos(\omega_c t \pm \alpha \cdot \pi/4),$$

where $\omega_c$ is a carrier frequency of said AM stereo signal, and wherein said phase control means comprises means for varying said $\alpha$ in response to said intensity of said received electric field.

3. The AM stereo demodulator of claim 2, wherein said phase control means varies said $\alpha$ between values of 1 and 0.5.

4. The AM stereo demodulator of claim 1, wherein said phase control means comprises: a plurality of flip-flops, at least one of which receives as a clock input said AM stereo signal, for producing a plurality of signals have different phases with respect to said AM stereo signal, and gating means for selecting as said reference signals ones of said signals of different phases in accordance with said intensity of said received electric field.

5. The AM stereo demodulator of claim 4, wherein said gating means comprises: means for comparing a signal representing said intensity of said received AM stereo signal with a reference level, and selector means receiving as data inputs outputs of said flip-flops and as a selection control input an output of said comparing means.

6. The AM stereo demodulator of claim 1, wherein said phase control means comprises: first and second pairs of transistors, each of said pairs being connected in a differential amplifier configuration, bases of one transistor of each of said pairs receiving a signal representing said intensity of said received AM stereo signal; and first and second current source transistors, each connected to commonly connected emitters of a respective one of said pairs, said first and second transistors receiving as base inputs signals of the form:

$$\cos(\omega_c t + \pi/4) \text{ and } \cos(\omega_c t - \pi/4),$$

respectively, where $\omega_c$ is a carrier frequency of said AM stereo signal, said first and second reference signals being produced on respective commonly connected collectors of said transistors of said first and second pairs of transistors.

* * * * *